United States Patent [19]

Lehning

[11] Patent Number: 4,524,291
[45] Date of Patent: Jun. 18, 1985

[54] TRANSITION DETECTOR CIRCUIT

[75] Inventor: Heinz Lehning, Nyon, Switzerland

[73] Assignee: Motorola, Inc., Schaumburg, Ill.

[21] Appl. No.: 456,064

[22] Filed: Jan. 6, 1983

[51] Int. Cl.³ ............................................. H03K 5/153
[52] U.S. Cl. ..................................... 307/354; 307/360; 307/517; 307/520
[58] Field of Search ............... 307/354, 360, 517, 518, 307/520, 234; 328/114, 109, 132

[56] References Cited

U.S. PATENT DOCUMENTS

| | | | |
|---|---|---|---|
| 3,944,936 | 3/1976 | Pryor | 307/354 |
| 4,291,356 | 9/1981 | Mathieu | 307/360 |
| 4,352,999 | 10/1982 | Galpin | 307/354 |

Primary Examiner—John Zazworsky
Attorney, Agent, or Firm—Vincent B. Ingrassia

[57] ABSTRACT

A noise-tolerant transition detector circuit (2) for detecting when an input signal rises above a first value (V2) and falls below a second value (V1) comprising: comparator means (12, 14) which produces a first output signal when the input signal rises above the first value and a second output signal when the input signal falls below the second value; and bistable means (20) which is set to its first stable state in response to the comparator means first output signal and which is set to its second stable state in response to the comparator means second output signal.

Noise may be further reduced by using further bistable means (26) and pulse-forming means (28, 30) may also be employed.

7 Claims, 3 Drawing Figures

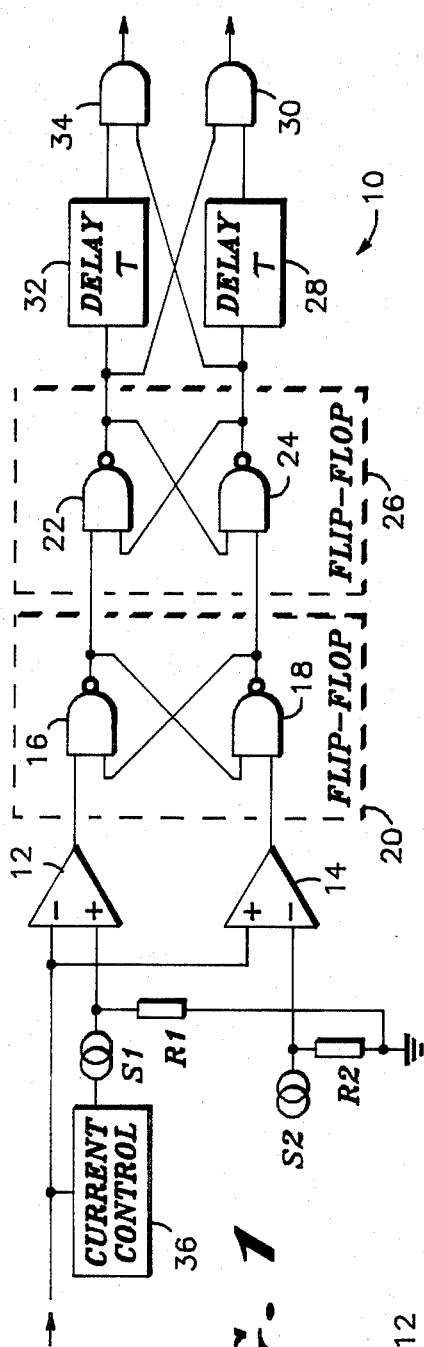
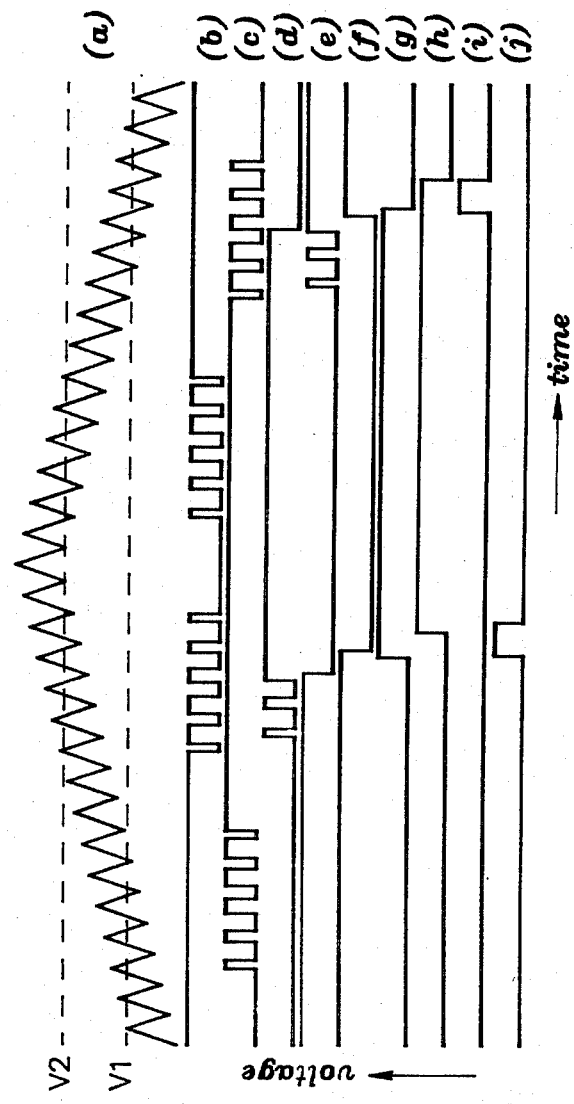
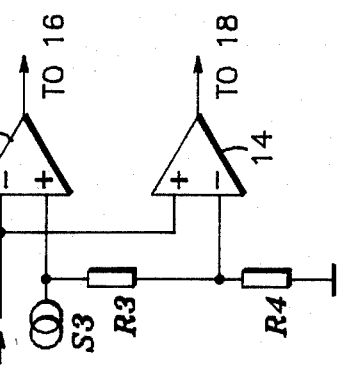
FIG. 1
FIG. 2
FIG. 3

TRANSITION DETECTOR CIRCUIT

FIELD OF INVENTION

This invention relates to circuits for detecting the transition of a signal through a defined value, and in particular to circuits for detecting when a signal rises above a first value and falls below a second value different from the first value.

DESCRIPTION OF THE PRIOR ART

Such transition detector circuits commonly consist of voltage comparators incorporating positive feedback from the output to the (positive) input in order to introduce hysteresis. In many applications transition detector circuits have to detect relatively low frequency signals which have relatively high frequency noise superimposed thereon.

A transition detector circuit should only respond to one transition crossing of each group of crossings. However in the above described type of transition detector circuit employing a comparator with feedback it often occurs that several transition crossings of each group are detected, causing several changes of state of the circuit output for each transition of the true, underlying signal. This parasitic bouncing of the circuit output may occur when the time delay in the feedback path is greater than the switching time of the comparator.

As the true signal level crosses one of the two predetermined transition values the added random, high-frequency noise causes the total signal level to cross and re-cross the transition value several times before crossing wholly to one side of the transition value, resulting in a group of transition crossings for each crossing of the true, underlying signal level.

It is an object of the present invention to provide a transition detector circuit wherein the above problems may be overcome or at least alleviated.

BREIF SUMMARY OF THE INVENTION

In accordance with the invention a trasition detector circuit for detecting when an input signal rises above a first value and falls below a second value different from said first value comprises comparator means having an input for receiving the input signal and having an output, the comparator means producing at its output a first output signal when the input signal rises above said first value and a second output signal when the input signal falls below second said value; and first bistable means having an input connected to said output of said comparator means and having an output, said first bistable means being set to a first stable state in response to said first output signal of said comparator means and producing at its output a first output signal indicative of said first stable state and being set to a second stable state in response to said second output signal of said comparator means and producing at its output a second output signal indicative of said second stable state.

One transition detector circuit in accordance with the invention will now be described, by way of example only, with reference to the accompanying drawings, in which:

BRIEF DESCRIPTION OF DRAWINGS

FIG. 1 shows a block-schematic diagram of the transition detector circuit;

FIG. 2 shows an alternative arrangement of part of FIG. 1; and

FIG. 3 shows voltage waveforms of various signals occurring the circuit of FIG. 1.

DETAILED DESCRIPTION OF EMBODIMENT OF INVENTION

Referring firstly to FIG. 1, the transition detector 10 includes two comparators in the form of differential amplifiers 12 and 14. An input signal (see FIG. 3(a)) is applied to the inverting input of comparator 12 and to the non-inverting input of comparator 14. A reference voltage V2 is applied to the non-inverting input of comparator 12 and a reference voltage V1, less than V2, is applied to the inverting input of comparator 14, the voltages being derived from current sources and fixed resistances S1, R1, and S2, R2 respectively.

The output of comparator 12 is applied to one input of a two-input NAND gate 16 and the output of comparator 14 is applied to one input of a two input NAND gate 18, the output of each of the NAND gates 16, 18 being connected to the other input of the other NAND gate so that the NAND gates 16, 18 form a "flip-flop" device 20.

The output of NAND gate 16 is connected to one input of a two-input NAND gate 22 and the output of NAND gate 18 is applied to one input of a two-input gate 24, the output of each of the NAND gates 22, 24 being connected to the other input of the other NAND gate so that the NAND gates 22, 24 form a flip-flop device 26.

The output of NAND gate 24 is connected to the input of a delay line 28 (formed by a series of logic gates—not shown) whose output is connected to one input of a two-input NAND gate 30. The other input of AND gate 30 is connected to the output of NAND gate 22.

The output of NAND gate 22 is connected to the input of a delay line 32 whose output is connected to one input of a two-input AND gate 34. The other input of AND gate 34 is connected to the output of NAND gate 24.

Referring now also to FIG. 3, the transition detector 10 operates as follows. The input signal (FIG. 3(a)) comprises an underlying voltage of low frequency represented by a triangular waveform, on which there is superimposed random, high frequency noise, represented by a higher frequency triangular waveform. When the input voltage is greater than V2 the output of comparator 12 goes low (FIG. 3(b)), and when the sensor output voltage is less than V1 the output of comparator 14 goes low (FIG. 3(c)). As will be seen from FIGS. 3(b) and 3(c) the presence of noise in the input voltage causes the outputs of comparators 12 and 14 to chatter between their high and low values when the underlying sensor output voltage crosses the values V2 and V1 respectively.

When the output of comparator 12 goes low the flip-flop 20 is set (i.e. the output of NAND gate 16 (FIG. 3(d)) goes high and causes the output of NAND gate 18 (FIG. 3(e)) to go low), and when the output of comparator 14 goes low the flip-flop 20 is reset (i.e. the output of NAND gate 18 goes high and causes the output of NAND gate 16 to go low).

However, as can be seen from FIGS. 3(d) and 3(e), chatter in the transitions of the outputs of the comparators 12 and 14 due to noise causes several pulses to be passed through NAND gates 16 and 18 before the flip-flop 20 latches to its set or reset state respectively. It will be seen that at this stage the negative-going edges of the outputs of both NAND gates 16 and 18 are already free from chatter feedthrough and it is only the positive-going edges which are degraded in this way.

In order to remove the chatter feedthrough from the positive-going edges of the outputs (FIGS. 3(d) and 3(e)) of the flip-flop 20, the outputs are applied to the flip-flop 26. When the output of NAND gate 18 goes low the flip-flop 26 is set (i.e. the output of NAND gate 24 (FIG. 3(g)) goes high and causes the output of NAND gate 22 (FIG. 3(f)) to go low) and when the output of NAND gate 16 goes low the flip-flop 26 is reset (i.e. the output of NAND gate 22 goes high and causes the output of NAND gate 24 to go low). Thus it will be seen that the outputs of NAND gates 22 and 24 are free from chatter feedthrough at both their positive-going and negative-going edges.

In order to produce from the outputs of flip-flop 26 a pulse of suitable width the output of each of the NAND gates 22, 24 is "AND"ed with a delayed version of the output from the other NAND gate. With the output of NAND gate 25 delayed (FIG. 3(h)) by delay line 28, AND gate 30 produces an output pulse (FIG. 3(i)) when the input voltage (FIG. 3(a)) falls below the voltage V1 after having been above the voltage V2.

With the output of NAND gate 22 delayed by delay line 32, AND gate 34 produces an output pulse (FIG. 3(j)) when the input voltage rises above the voltage V2 after having been below the voltage V1.

By deriving the voltage levels V1 and V2 separately the voltage levels may be varied independently of each other so that, for example, the voltage V1 may be kept at a constant predetermined value and the voltage V2 may be varied (by varying the current supplied by current source S2 via control means 36 as shown in FIG. 1) in dependence on the r.m.s. value or on the frequency of the input signal. Alternatively, if it is not desired to vary the voltage levels V1 and V2 independently, these voltages may be derived, as shown in FIG. 4 from a single current source S3 and a fixed resistance divider constituted by resistors R3 and R4. With such an arrangement it will be appreciated that the ratio of the voltage levels V1 and V2 remains constant, and although not so shown in FIG. 2 the values themselves may be varied (by varying the current supplied by the current source as in FIG. 2), for example in dependence on the r.m.s. value of the input signal.

Thus it will be appreciated that the above described transition detector circuit exhibits good performance in the presence of noise since the output pulses produced at the transitions of the input signal are not affected by noise in the input signal, provided that the noise amplitude is not greater than the difference between the voltage levels V1 and V2.

It will also be appreciated that the noise immunity of the above described transition detector circuit is independent of the delay times and switching speeds of the components used in the circuit.

I claim:

1. A transition detector circuit for detecting when an input signal rises above a first value and falls below a second value different from said first value, the circuit comprising:
    comparator means having an input for receiving the input signal and having an output, the comparator means producing at its output a first output signal when the input signal rises above said first value and a second output signal when the input signal falls below said second value;
    first bistable means having an input connected to said output of said comparator means and having an output, said first bistable means being set to a first stable state in response to said first output signal of said comparator means and producing at its output a first output signal indicative of said first stable state and being set to a second stable state in response to such second output signal of said comparator means and producing at its output a second output signal indicative of said second stable state; and
    second bistable means having an input connected to said output of said first bistable means and having an output, said second bistable means being set to a first stable state in response to such first output signal of such first bistable means and producing at its output a first output signal indicative of such first stable state and being set to a second stable state in response to said second output signal of such first bistable means and producing at its output a second signal indicative of said second stable state.

2. A transition detector circuit according to claim 1 further comprising pulse-producing means having an input connected to said output of said second bistable means and having an output, said pulse-producing means producing at its output a pulse signal in response to a selected one of said first output signal and said second output signal of said second bistable means.

3. A transition detector according to claim 2 wherein said pulse-producing means comprises:
    logic means having a first input and a second input connected to receive respectively said first output signal and said second output signal of said second bistable means and having an output, said logic means producing at its output an output signal when a selected one of the output signals of the second bistable means is present and the other one of the output signals of the second bistable means is absent; and
    delay means connected between the output of said second bistable means and one of the inputs of said logic means for delaying said selected one of the output signals of the second bistable means.

4. A transition detector circuit according to claim 1, wherein said comparator means comprises:
    a first comparator having a first input for receiving the input signal, a second input connected to a signal source representative of said first value and having an output, said first comparator producing at its output said first output signal when the input signal rises above said first value; and a second comparator having a first input for receiving the input signal, a second input connected to a signal source representative of said second value and having an output, said second comparator producing at its output said second output signal when the input signal falls below said second value.

5. A transition detector circuit according to claim 1 wherein said first value and said second value are in a predetermined ratio.

6. A transition detector circuit according to claim 5 wherein said first value and said second value are defined by respective voltage levels and the circuit further comprises a fixed resistance voltage divider from which said voltage levels are derived.

7. A transition detector circuit according to claim 1 further comprising means for varying at least one of said first vlaue and said second values independently of the other of said first and second values.

* * * * *